United States Patent
Chang

(10) Patent No.: US 6,813,157 B2
(45) Date of Patent: Nov. 2, 2004

(54) MOTHER BOARD AND COMPUTER SYSTEM CAPABLE OF FLEXIBLY USING SYNCHRONOUS DYNAMIC RANDOM ACCESS MEMORY AND DOUBLE DATA RATE DYNAMIC RANDOM ACCESS MEMORY

(75) Inventor: Nai-Shung Chang, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/156,986

(22) Filed: May 28, 2002

(65) Prior Publication Data

US 2002/0196650 A1 Dec. 26, 2002

Related U.S. Application Data

(62) Division of application No. 09/672,919, filed on Sep. 28, 2000, now Pat. No. 6,424,555.

(30) Foreign Application Priority Data

Dec. 10, 1999 (TW) .......................................... 88121713 A

(51) Int. Cl.[7] .............................................. H05K 7/00
(52) U.S. Cl. .................... 361/728; 361/738; 361/761; 361/785; 361/788; 361/803; 365/63
(58) Field of Search .............................. 361/728, 803, 361/738, 761, 763, 764, 782, 785, 788, 736, 737, 683, 18, 767; 710/301

(56) References Cited

U.S. PATENT DOCUMENTS

| | | | | |
|---|---|---|---|---|
| 5,428,288 A | * | 6/1995 | Foreman et al. ............ 324/142 |
| 5,563,838 A | * | 10/1996 | Mart et al. ................... 365/226 |
| 5,705,922 A | * | 1/1998 | VanDyke ..................... 323/354 |
| 5,821,767 A | * | 10/1998 | Osaka et al. .................. 326/30 |
| 5,831,890 A | * | 11/1998 | Selna et al. ................... 365/51 |
| 6,205,194 B1 | * | 3/2001 | Lafon ......................... 375/377 |
| 6,351,827 B1 | * | 2/2002 | Co et al. ....................... 714/42 |
| 6,442,644 B1 | * | 8/2002 | Gustavson et al. ......... 711/105 |
| 6,453,421 B1 | * | 9/2002 | Taylor ......................... 713/300 |
| 6,461,169 B1 | * | 10/2002 | Harrison et al. .............. 439/65 |
| 6,496,380 B1 | * | 12/2002 | Li et al. ...................... 361/760 |
| 6,665,736 B1 | * | 12/2003 | Fan ............................... 710/2 |
| 2001/0045816 A1 | * | 11/2001 | Sanders ....................... 323/282 |

\* cited by examiner

Primary Examiner—Evan Pert
Assistant Examiner—Thanh Y. Tran
(74) Attorney, Agent, or Firm—J.C. Patents

(57) ABSTRACT

A mother board and a computer system capable of flexibly using the SDRAM and the DDRAM. The mother board has several memory module slots, a voltage comparator, a clock generator and a chip set. Each of the memory module slots comprises a reference voltage pin, and the reference voltage pins of the memory module slots are connected to each other in parallel. The voltage comparator is coupled to the reference voltage pins of the memory module slots to detect whether the voltage at the reference voltage pin is equivalent to a reference voltage. The clock generator is coupled to an output of the voltage comparator. When the voltage at the reference voltage pin is equal to the reference voltage, a differential clock signal is generated, and when the votlage is different from the reference voltage, a normal clock signal is generated. The chip set is coupled to the output of the voltage comparator. When the voltage is equal to the reference voltage, the chip set is operated under a double data rate mode. If the voltage is different from the reference voltage, the chip set is operated under a normal data rate mode.

4 Claims, 5 Drawing Sheets

MOTHER BOARD AND COMPUTER SYSTEM CAPABLE OF FLEXIBLY USING SYNCHRONOUS DYNAMIC RANDOM ACCESS MEMORY AND DOUBLE DATA RATE DYNAMIC RANDOM ACCESS MEMORY

CROSS-REFERENCE TO RELATED APPLICATION

This application is a divisional application of, and claims the priority benefit of, U.S. application Ser. No. 09/672,919 filed on Sep. 28, 2000 now U.S. Pat. No. 6,424,555.

BACKGROUND OF THE INVENTION

1. Field of the Invention

The invention relates to a computer system. More particular, the invention relates to a mother board and a computer system that can flexibly use the synchronous dynamic random access memory (SDRAM) and the double data rate (DDR) DRAM (DDRAM).

2. Description of the Related Art

Currently, a general personal computer comprises a mother board, interface cards and periphery accessories, and the mother board is a heart of the personal computer. On the mother board, in addition to the central processing unit (CPU), the chip set and the slots for installing the interface cards, it further includes the memory module slot to installing memory modules. According to different requirements of users, the amount of the memory module slots for installing memory modules is variable. Typically, a memory module comprises several memory devices.

For the memories normally used in a personal computer such as the synchronous dynamic random access memory, the operation thereof is to perform data access control in correspond with the raising edge of the system clock signal. Under the mode of the double data rate, the memory can perform data access control during both the raising edge and falling edge of the system clock signal. Thus, the operation speed of the memory is fastened.

The difference in operating the SDRAM and the DDRAM includes: (1) the SDRAM uses a normal clock signal, while the DDR DRAM uses a differential clock signal; (2) the $V_{DD}$ of SDRAM equals to 3.3V, the $V_{DD}$ of DDRAM equals to 3.3V, while $V_{DDQ}$=2.5V; (3) SDRAM does not require a reference voltage, while DDRAM requires a reference voltage; (4) the data bus connected to the SDRAM is normal CMOS logic, and the data bus connected to the DDRAM is series stub terminated logic 2 (SSTL_2); (5) the data bus connected to the SDRAM does not require a terminated voltage $V_{TT}$, but the data bus connected to the DDRAM requires a $V_{TT}$ to absorb reflective electric wave; (6) the data bus connected to the SDRAM does not require using a pull-up resistor, but the data bus connected to the DDRAM requires the pull-up resistor. The advantage of using DDRAM instead of SDRAM is the double data rate.

Currently, the computer using DDRAM belongs to the high cost ones such as net server or advance personal computer. The mother board thereof provides memory module slots for mainly supporting DDRAM. A mother board comprising a chip set memory supporting SDRAM/DDRAM memory modules can also be seen in the market. However, the mother board can only select to support one of the memory modules, for example, either the SDRAM module or the DDRAM module, at a time. Since the data bus connected to the DDRAM module is series stub terminated logic 2, a voltage regulator and several pull up resistors are required on the mother board to provide the terminated voltage $V_{TT}$ for the purpose of absorbing electric wave. Therefore, even the chip set can support both SDRAM/DDRAM modules, only one of them can be selected during production. That is, the mother board to support the SDRAM cannot support the DDRAM. A single mother board cannot support both the SDRAM and the DDRAM. The function of the chip set thus cannot be exploited. While producing the mother board that support DDRAM, the requirement of the voltage regulator and the pull-up resistors are disposed on the mother board. The surface area of the printed circuit board (PCB) is thus increase, the cost is accordingly raised.

SUMMARY OF THE INVENTION

The invention provides a mother board that can flexibly uses the SDRAM or DDRAM to enable users to flexibly uses the SDRAM module and the DDRAM module.

A terminated circuit module is also provided in the invention. Thus, the mother board manufacturer can dispose the voltage regulator and the pull-up resistors required by the data bus connected to the DDRAM on the terminated circuit module to save the consumed surface area of the PCB.

Furthermore, a memory module, for example, a memory module with 184 pins, is provided to enable the manufacturer to dispose the SDRAM at a position where a DDRAM is located. In this manner, the SDRAM can also be used for a mother board that comprises a memory module slot supporting a memory with 184 pins.

The mother board provided by the invention comprises several memory module slots, a voltage comparator, a clock generator and a chip set. Each of the memory module slots comprises a reference voltage pin, and the reference voltage pins of the memory module slots are connected to each other in parallel. The voltage comparator is coupled to the reference voltage pins of the memory module slots to detect whether the voltage at the reference voltage pin is equivalent to a reference voltage. The clock generator is coupled to an output of the voltage comparator. When the voltage at the reference voltage pin is equal to the reference voltage, a differential clock signal is generated, and when the votlage is different from the reference voltage, a normal clock signal is generated. The chip set is coupled to the output of the voltage comparator. When the voltage is equal to the reference voltage, the chip set is operated under a double data rate mode. If the voltage is different from the reference voltage, the chip set is operated under a normal data rate mode.

The invention also provides a mother board that comprises;a chip set that supports both SDRAM/DDRAM modules. The voltage regulator and the pull-up resistors required by the data bus connected to the DDRAM module are installed in a terminated circuit module. While the SDRAM module is in use, all the memory module slots have to be inserted with the SDRAM modules. When the DDRAM is selected, the DDRAM modules are installed in the memory module slots, and a memory module subsequent to the DDRAM module is inserted to the terminated circuit module. Thus, one the same mother board, the user can select to use either the SDRAM module or the DDRAM module.

The terminated circuit module of the invention can be applied to a mother board comprising several memory module slots. Each of the memory module slot comprises several signal lines. The terminated circuit module comprises a printed circuit board, a voltage regulator and several terminated resistors. The printed circuit board can be inserted into any of the memory module slots to proved an electrical connection between the terminated circuit module and the memory module slots. The voltage regulator is disposed on the printed circuit board to provide a terminated voltage. The terminated resistors are disposed on the printed circuit board and coupled to the voltage regulator. One side of each terminated resistor is coupled to one of the signal line, while the other side of each terminated resistor is coupled to the terminated voltage. The memory module slots meet the 184 pins or 224 pins of JEDEC standard. The memory module slots comprise reference voltage pins. When the terminate circuit module is inserted into any of the memory module slot, the voltage regulator provides a reference voltage that meets the specification of SSLT_2 bus of the JEDEC standard to the reference voltage pin.

The memory module provide in the invention can be applied to a mother board comprising memory module slots. The memory modules comprise a printed circuit board which can be inserted into the memory module slot and several SDRAM modules disposed on the printed circuit board. The memory module meets the specification of the memory module slot with 184 pins or 224 pins of JEDEC standard.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate an embodiment of the invention and together with the description, serve to explain the principles of the invention. In the drawings.

DESCRIPTION OF THE PREFERRED EMBODIMENTS

Figure 1:
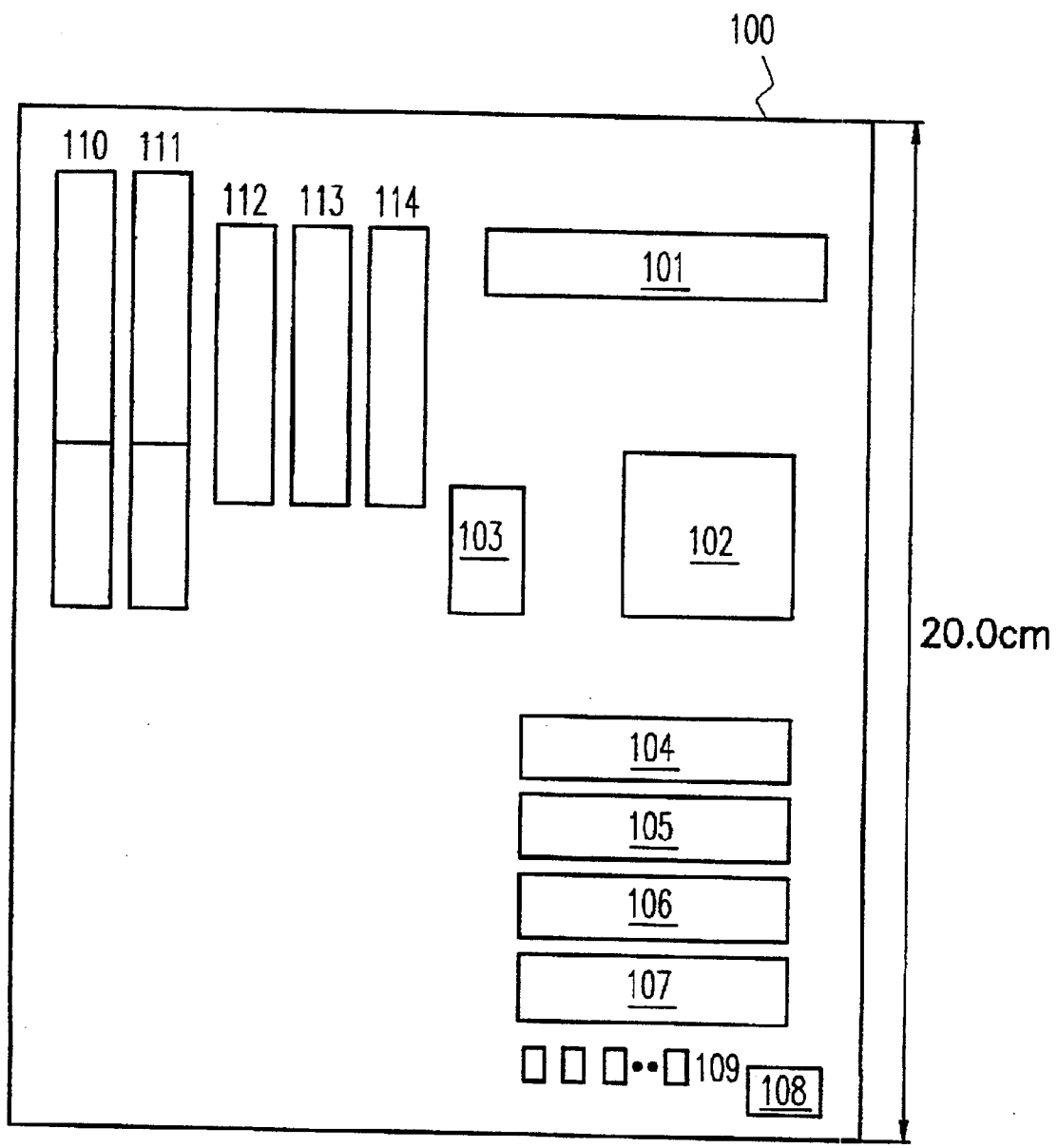
FIG. 1 is a layout for devices included in a computer mother board that supports DDRAM module only.

FIG. 1 shows a devices layout for a computer mother board that support DDRAM module only. The mother board 100 comprises a CPU slot 101, a chip set 102, a differential clock generator 103, several memory module slots 104–107, a voltage regulator 108, several terminated resistors 109, several PCI slots 112–114 and several ISA slots 110–111. The CPU slot provides the installation for a CPU. The chip set 102 supports DDRAM memory. The differential clock generator 103 is used to generate the differential clock signal required by the DDRAM module. The memory modules 104–107 allow several DDRAM modules to be inserted. The voltage regulator 108 provides a terminated voltage required by the data bus connected to the DDRAM module. The terminated resistors 109 absorb the electrical wave from transmission lines of data bus connected to the DDRAM module. PCI interface cards can be inserted into the PCI slots 112–114, and ISA interface cards can be inserted into the ISA slot.

Thus constructed, the terminated resistors 109 and the voltage regulator 108 occupy a considerable area of the printed circuit board of the mother board 100, for example, with a length of only 20 cm as shown in FIG. 1. The mother board 100 can thus supports only DDRAM module, but incapable of supporting SDRAM module. Currently, the fabrication cost, and consequently the market price for the DDRAM module is much higher compared to the SDRAM module. Therefore, the application of the DDRAM module includes only the high level computer such as net server.

Figure 2:
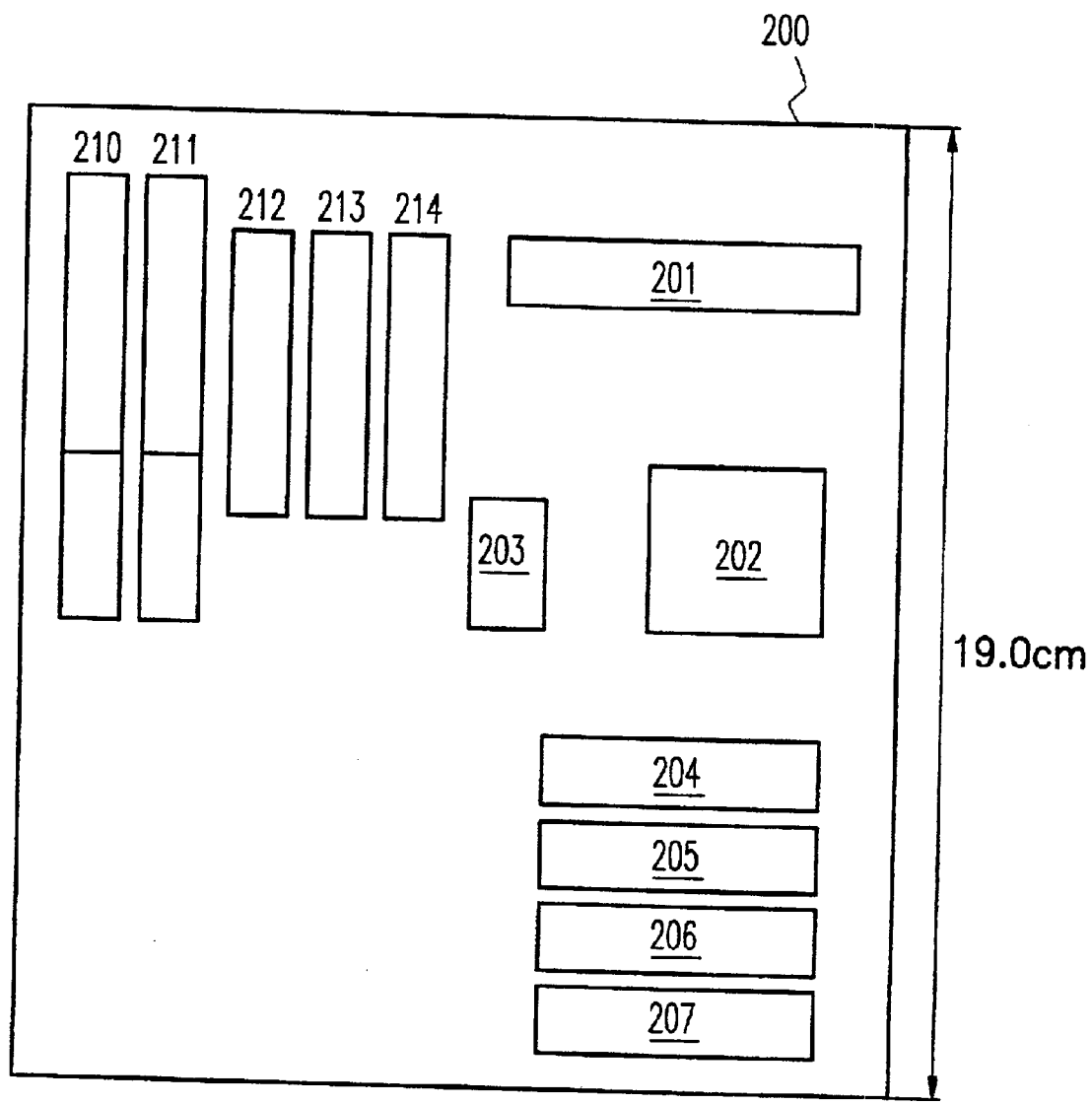
FIG. 2 shows the layout for devices included in a mother board that supports both SDRAM/DDRAM modules.

FIG. 2 shows a mother board that can support both SDRAM?DDRAM module provided by the invention. The mother board 200 comprises a CPU slot. 200, a chip set 202, a differential clock generator 203, several memory module slots 204–207, several PCI slots 212–214 and several ISA slots 210–211. The functions of the CPU slot 200, the memory module slots 204–207, the PCI slots 212–214 and the ISA slots 210–211 are the same as those as shown in FIG. 1. The chip set 202 supports both the SDRAM module and the DDRAM module. The user can select either the SDRAM or the DDRAM module to use according to practical requirement. The differential clock generator 203 is used according to the differential clock signal required by the DDRAM module or the normal clock signal required by the SDRAM module. In this invention, several terminated resistors 109 and a voltage regulator 108 are installed on a terminated circuit module 300 external to the mother board 200. The terminated circuit module 300 is then inserted to one of the memory module slots 204–207 of the mother board when the DDRAM module is selected to be used. As a result, the printed circuit board for the mother board can be shrunk with a length of 19 cm. That is, compared to the currently printed circuit board supporting only one memory module, the length can be reduced with at least 1 cm.

Each of the memory module slots 204–207 on the mother board 200 comprises a reference voltage pin which is connected to each other in parallel. The differential clock generator 203 is coupled to the reference voltage pins of the memory module slots 204–207 to detect whether the voltage at each reference voltage pin are equal to a reference voltage. When the voltage equals to the reference voltage, a differential clock signal is generated. When the voltage is not equal to the reference voltage, a normal clock signal is generated. The chip set 202 is coupled to an output of the differential clock generator 203. When the voltage is equal to the reference, the chip set 202 is operated under a double data rate mode to access the DDR memory module. When the voltage is different from the reference voltage, the chip set 202 is operated under a normal data rate mode (SDRAM mode) to access the SDRAM module. The memory module slots 204 207 all meet the specification for memory module slot with 184 pins or 224 pins of JEDEC standard. The reference voltage is within a range of the SSTL_2 bus specification of JEDEC standard. For example, the reference voltage can be about 1.25V. It is appreciated that the reference voltage can also be at other magnitude without being limited to 1.25V only.

Figure 3:
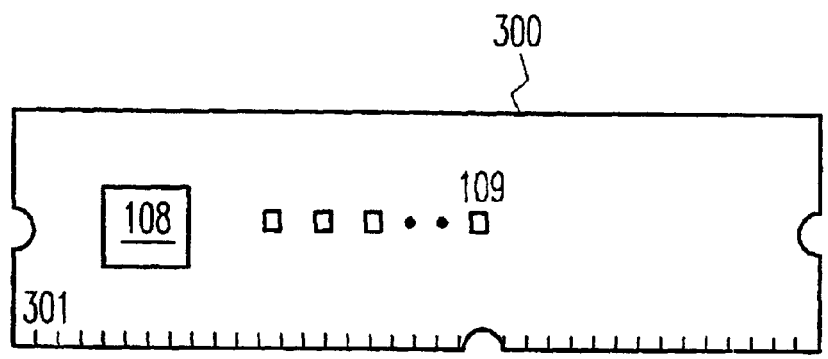
FIG. 3 shows a layout of devices included by a terminated circuit module with the voltage regulator and the terminated resistors disposed out of the mother board.

FIG. 3 shows a layout of the terminated circuit module comprising a voltage regulator and several terminated resistors. The invention provides further a terminated circuit module. The terminated circuit module is applied to the mother board 200 including the memory module slots 204–204 each of which further comprises several signal lines. The terminated circuit module 300 comprises a printed circuit board 301 that can be inserted into any of the memory module slots 204–207, a voltage regulator 108 and several terminated resistors 109 located on the printed circuit board 301. The voltage regulator 108 provides a terminated voltage to one side of the terminated resistors 109, and the other side of the terminated resistors are coupled to the signal lines. When the terminated circuit module 300 is inserted into any of the memory module slots 204–207, the voltage regulator 108 provides a reference voltage to the reference voltage pin. The reference voltage provided by the voltage regulator 108 meets the SSTL_2 bus specification of JEDEC standard. For example, the reference voltage can be at 1.25V without being restricted thereto.

Figure 4:
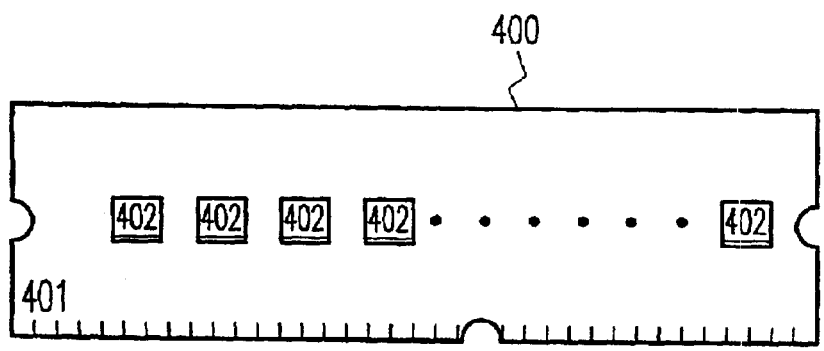
FIG. 4 shows a device layout for disposing the SDRAM into a memory module with 184 pins.

FIG. 4 shows a layout for installing the SDRAM into a memory module with 184 pins. The memory module 400 can be applied to the mother board 200 as shown in FIG. 2. The mother board 200 comprises the memory module slots 204–207 with 184 pins. The memory module 400 comprises a printed circuit board 400 that can be inserted into any of the memory module slots 204–207, and several SDRAMs 402 on the printed circuit board 400. In a conventional mother board, the memory module with 184 pins is only applicable for DDRAM. Therefore, when the mother board 200 supports only DDRAM, the memory module slots 204–207 support only the memory modules with 184 pins. Therefore, one can not find SDRAM disposed in a memory module with 184 pins. The invention disposes the SDRAM 402 into the memory modules with 184 pins, that is, the invention enables the utility of a memory module for SDRAM 402. Table 1 shows an example of the pin layout for a DDRAM with 184 pins. It is appreciated that memory module with other pin numbers such as 168 pins or 224 pins can also be applied to the invention.

TABLE 1

Pin Layout for a DDRAM module with 184 pins

| PIN# | NAME | PIN# | NAME | PIN# | NAME | PIN# | NAME | PIN# | NAME |
|---|---|---|---|---|---|---|---|---|---|
| 1 | Vref | 39 | DQ26 | 76 | CK2 | 114 | DQ20 | 151 | DQ39 |
| 2 | DQ0 | 40 | DQ27 | 77 | Vddq | 115 | A12 | 152 | Vss |
| 3 | Vss | 41 | A2 | 78 | DQS6 | 116 | Vss | 153 | DQ44 |
| 4 | DQ1 | 42 | Vss | 79 | DQ50 | 117 | DQ21 | 154 | /RAS |
| 5 | DQS0 | 43 | A1 | 80 | DQ51 | 118 | A11 | 155 | DQ45 |
| 6 | DQ2 | 44 | CB0 | 81 | Vss | 119 | DM2 | 156 | Vddq |
| 7 | Vdd | 45 | CB1 | 82 | Vddid | 120 | Vdd | 157 | /CS0 |
| 8 | DQ3 | 46 | Vdd | 83 | DQ56 | 121 | DQ22 | 158 | /CS1 |
| 9 | NC | 47 | DQS8 | 84 | DQ57 | 122 | A8 | 159 | DM5 |
| 10 | NC | 48 | A0 | 85 | VDD | 123 | DQ23 | 160 | Vss |
| 11 | Vss | 49 | CB2 | 86 | DQS7 | 124 | Vss | 161 | DQ46 |
| 12 | DQ8 | 50 | Vss | 87 | DQ58 | 125 | A6 | 162 | DQ47 |
| 13 | DQ9 | 51 | CB3 | 88 | DQ59 | 126 | DQ28 | 163 | Nc/cs3 |
| 14 | DQS1 | 52 | BA1 | 89 | Vss | 127 | DQ29 | 164 | Vddq |
| 15 | Vddq | KEY | KEY | 90 | WE | 128 | Vddq | 165 | DQ52 |
| 16 | CK0 | 53 | DQ32 | 91 | SDA | 129 | DM3 | 166 | DQ53 |
| 17 | /CK0 | 54 | Vddq | 92 | SCL | 130 | A3 | 167 | Nc Feten |
| 18 | Vss | 55 | DQ33 | 93 | Vss | 131 | DQ30 | 168 | Vdd |
| 19 | DQ10 | 56 | DQS4 | 94 | DQ4 | 132 | Vss | 169 | DM6 |
| 20 | DQ11 | 57 | DQ34 | 95 | DQ5 | 133 | DQ31 | 170 | DQ54 |
| 21 | CKE0 | 58 | Vss | 96 | Vddq | 134 | CB4 | 171 | DQ55 |
| 22 | Vddq | 59 | BA0 | 97 | DM0 | 135 | CB5 | 172 | Vddq |
| 23 | DQ16 | 60 | DQ35 | 98 | DQ6 | 136 | Vddq | 173 | NC |
| 24 | DQ17 | 61 | DQ40 | 99 | DQ7 | 137 | CK1 | 174 | DQ60 |
| 25 | DQS2 | 62 | Vsdq | 100 | Vss | 138 | /CK1 | 175 | DQ61 |
| 26 | Vss | 63 | /WE | 101 | NC | 139 | Vss | 176 | Vss |
| 26 | A9 | 64 | DQ41 | 102 | NC | 140 | DM8 | 177 | DM3 |
| 28 | DQ18 | 65 | /CAS | 103 | A13 | 141 | A10 | 178 | DQ62 |
| 29 | A7 | 66 | Vss | 104 | Vddq | 142 | CB6 | 179 | DQ63 |
| 30 | Vddq | 67 | DQS5 | 105 | DQ12 | 143 | Vddq | 180 | Vddq |
| 31 | DQ19 | 68 | DQ42 | 106 | DQ13 | 144 | CB7 | 181 | SA0 |
| 32 | A5 | 69 | DQ43 | 107 | DM1 | KEY | KEY | 182 | SA1 |
| 33 | DQ24 | 70 | Vdd | 108 | Vdd | 145 | Vss | 183 | SA2 |
| 34 | Vss | 71 | Nc/cs2 | 109 | DQ14 | 146 | DQ36 | 184 | Vss |
| 35 | DQ25 | 72 | DQ48 | 110 | DQ15 | 147 | DQ37 | | |
| 36 | DQS3 | 73 | DQ49 | 111 | CKE1 | 148 | Vdd | | |
| 37 | A4 | 74 | Vss | 112 | Vddq | 149 | DM4 | | |
| 38 | Vdd | 75 | /CK2 | 113 | BA2 | 150 | DQ38 | | |

Figure 5:
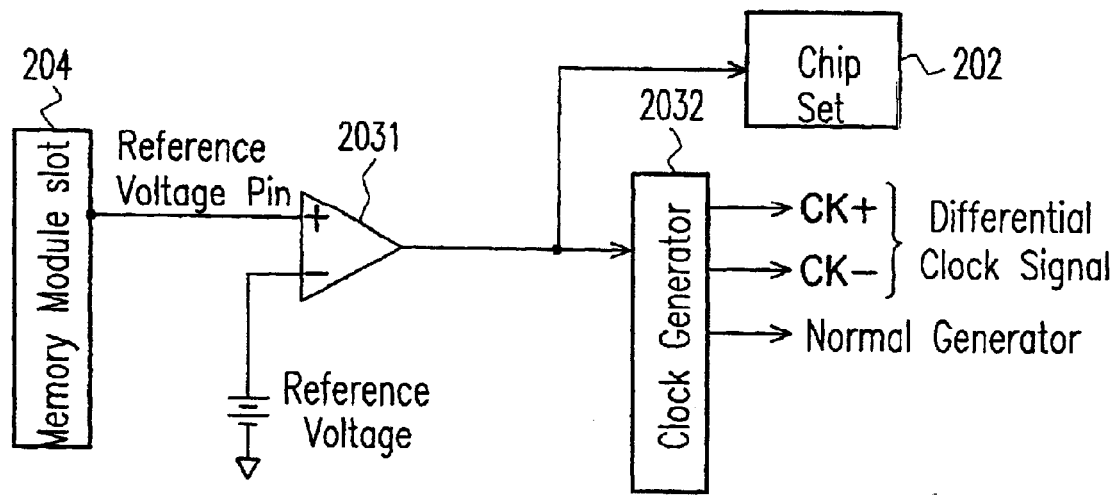
FIG. 5 shows a block diagram for a differential clock generator.

FIG. 5 shows a block diagram of a differential clock generator. The differential clock generator 203 is applied to a computer system comprising a mother board 200 as shown in FIG. 2. The mother board 200 further comprises several memory module slots 204–207, and each of which comprises a reference voltage pin and several signal lines, a voltage comparator 2031, a clock generator 2032., a chip set 202 and a memory module 400. The voltage comparator 2031 is coupled to the reference voltage pin of each memory module slot 204–207 to detect whether the voltage thereof is equal to a reference voltage. The clock generator 2032 is coupled to an output of the voltage comparator 2031. The chip set 202 is coupled to the output of the voltage comparator 2031. The memory module 400 inserted into one of the memory module slots 204–207 comprises the printed circuit board 401 and the SDRAMs; on the printed circuit board 401. When the voltage detected by the voltage comparator 2031 is not equal to the reference voltage, a normal clock signal is generated by the clock generator 2032 and is provided to the memory module 400. The voltage comparator 2031 also enables the chip set 202 to operate under a normal data rate mode to access the data of the memory module 400. Being compared with the reference voltage, a comparison result is sent to the clock generator 2032 to generate differential clock signal CK+ and CK− required by the DDRAM module. The voltage comparator 2031 comprises, for example, an operation amplifier (OP AMP). In this manner, the normal clock signal for the SDRAM module or the differential clock signal can be generated, The memory module slots 204–207 comprise, for example, 184 pins, 224 pins or other number of pins as specifically required.

Figure 6A:
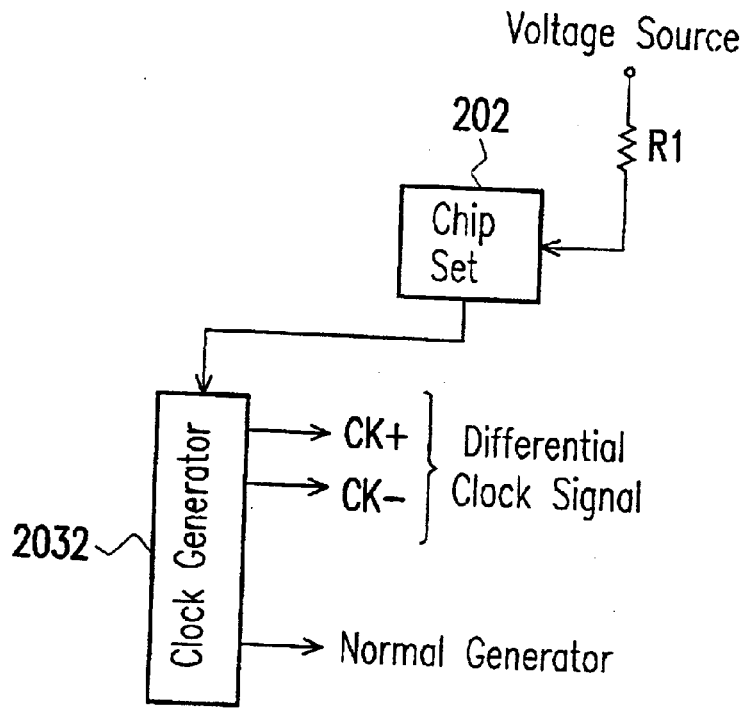
FIG. 6A is a block diagram for a differential clock generator activated by coupling with a resistor.

In FIG. 6A, a block diagram of activating the differential clock generator by coupling the resistor is shown. The mother board for flexibly using the DDRAM and SDRAM comprises several memory module slots 204–207, a chip set 202, and a clock generator 2032. Each of the memory module slots 204–207 comprises a reference voltage pin connected with each other in parallel. The chip set 202 comprises a memory module pin (not shown). While being framed or set, the chip set 202 is operated under a double data rate mode, and the chip set 202 is operated under a normal data rate mode without being framed. The clock generator 2032 is coupled to the chip set 202. When the chip set 202 is operated under a double data rate mode, the clock generator 2032 generates differential clock signals CK+ and CK−. When the chip set 202 is operated under a normal data rate, the clock generator 2032 generates a normal clock signal CK. The memory module pin can be framed or set by coupling to a resistor R1 connected to a voltage source. The memory module pin may also connected to ground via coupling the R1 to ground. The memory module slots meet the specification of memory module slot with 184 pins of the JEDEC standard. In addition, the reference also meets the SSTL_2 bus specification of the JEDEC standard. Alternatively, the memory module slots meet the specification of memory module slots with 224 pins.

Figure 6B:
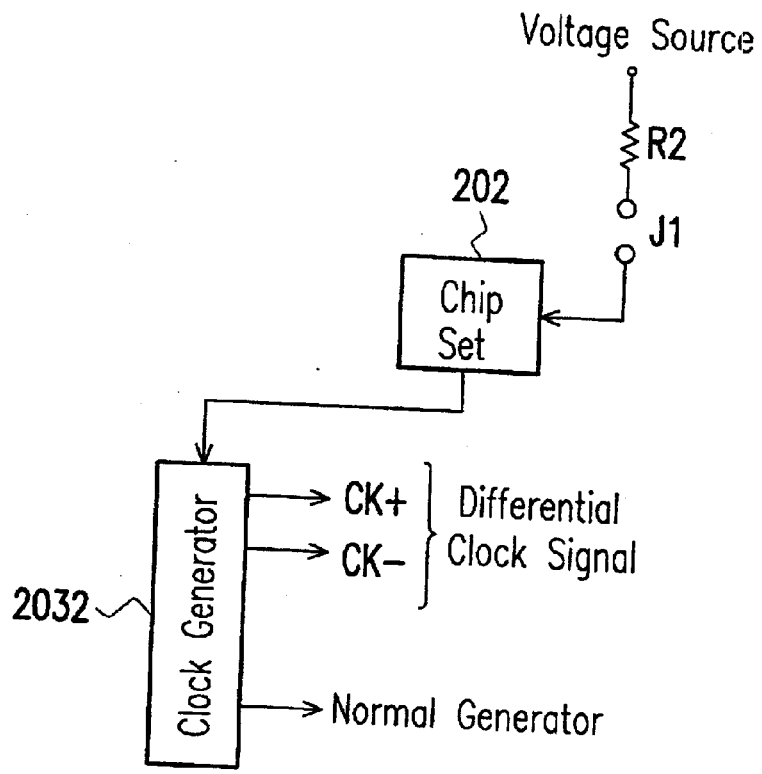
FIG. 6B is a block diagram for a differential clock generator activated by a jumper.

In FIG. 6B, a block diagram of activating a differential clock generator by coupling with a resistor is shown. The mother board for flexibly using the DDRAM and SDRAM comprises several memory module slots 204–207, a chip set 202, and a clock generator 2032. Each of the memory module slots 204–207 comprises a reference voltage pin connected with each other in parallel. The chip set 202 comprises a memory module pin (not shown). While being framed or set, the chip set 202 is operated under a double data rate mode, and the chip set 202 is operated under a normal data rate mode without being framed. The clock generator 2032 is coupled to the chip set 202. When the chip set 202 is operated under a double data rate mode, the clock generator 2032 generates differential clock signals CK+ and CK−. When the chip set 202 is operated under a double data rate mode, the clock generator 2032 generates a normal clock signal CK. The memory module pin can be framed by connecting to a voltage source by series coupling to a resistor R2 via coupling to a jumper J1 and when the jumper J1 is shorted circuited. When the juniper J1 is short circuited, the memory module pin is connected to the voltage via the resistor R2, and the memory module pin is thus framed. When the jumper J1 is open circuited, the memory module pin is not framed. However, the memory module pin can be connected to ground and framed via the jumper J1 and the resistor.

Figure 7A:
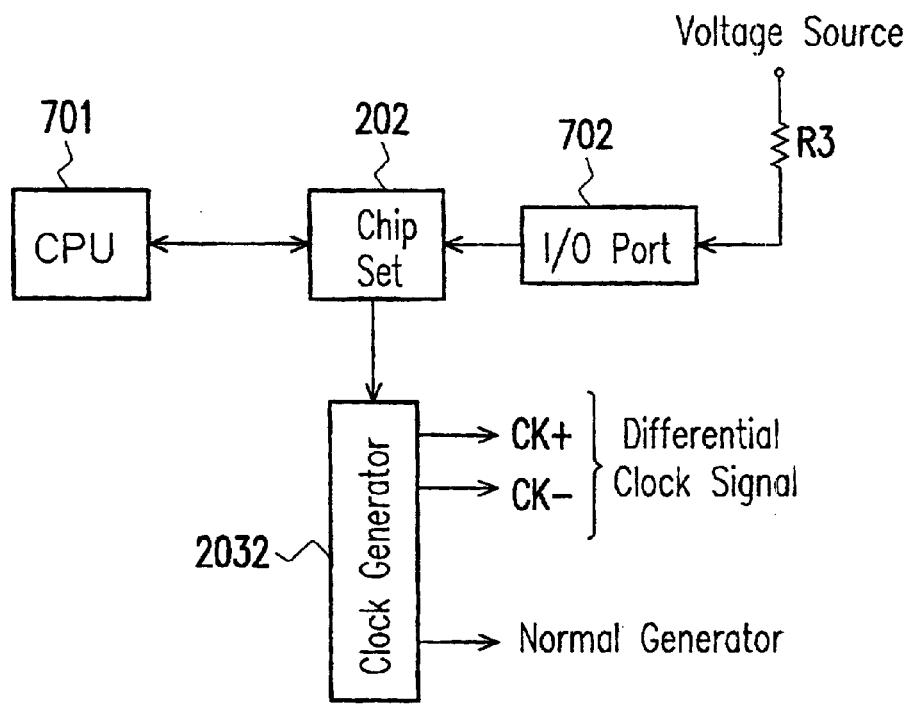
FIG. 7A is a block diagram for a differential clock generator activated by coupling with a resistor and an I/O port.

FIG. 7A shows a block diagram of activating a differential clock generator via an I/O port and coupling to a resistor. The mother board that can flexibly uses both DDRAM and SDRAM comprises several memory slots (204–207), a central processing unit 701, a chip set 202, an I/O port 702 and a clock generator 2032. Each of the memory module slot comprises a reference voltage pin connected to each other in parallel. The chip set 202 is coupled to the CPU 701. The I/O port, coupled to the chip set 202 comprises memory mode bit (not shown). The clock generator is coupled to the chip set 202 to generates a differential clock signal or a normal clock signal. When the memory mode bit is framed, being read by the CPU 701, the chip set 202 is operated under a double data rate mode to command the clock generator 2032 to generate differential clock signals CK+ and CK−. When the memory mode bit is not framed, the chip 202 is operated under a normal data rate mode, so that a normal clock signal CK is generated by the clock generator 2032. The memory mode bit can be connected to be framed by coupling to a resistor R3. However, the memory mode bit can also be connected to ground via the resistor R3. The memory module slots meet the specification of memory module slot with 184 pins of the JEDEC standard. In addition, the reference also meets the SSTL_2 bus specification of the JEDEC standard. Alternatively, the memory module slots meet the specification of memory module slots with 224 pins.

Figure 7B:
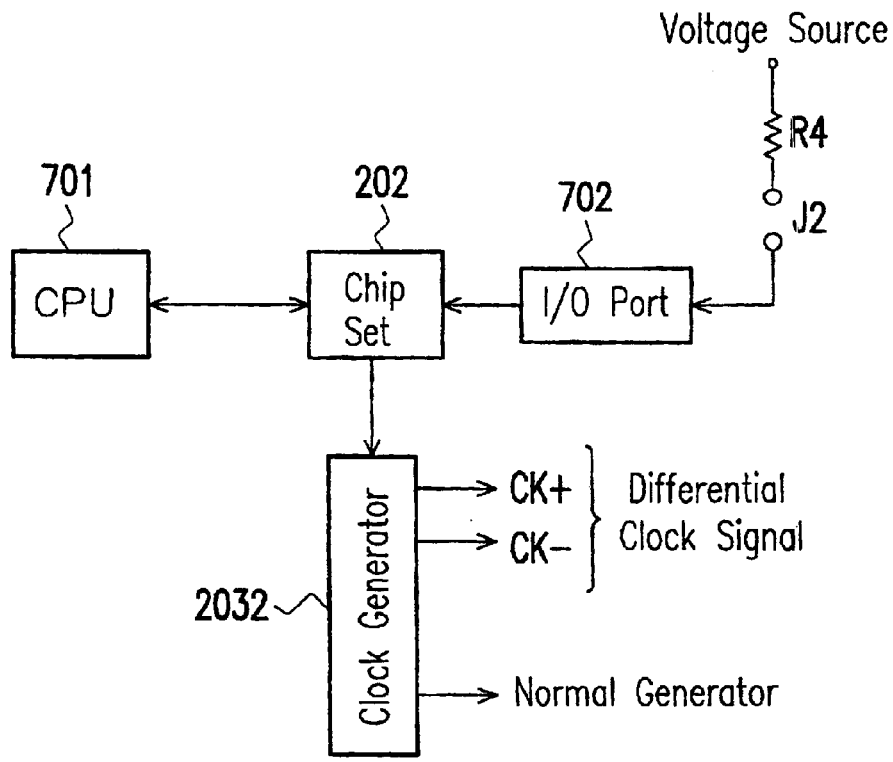
FIG. 7B is a block diagram for a differential clock generator activated by an I/O port and a jumper.

FIG. 7B shows a block diagram of activating a differential clock generator via an I/O port and coupling to a resistor. The mother board that can flexibly uses both DDRAM and SDRAM comprises several memory slots (204–207), a central processing unit 701, a chip set 202, an I/O port 702 and a clock generator 2032. Each of the memory module slot comprises a reference voltage pin connected to each other in parallel. The chip set 202 is coupled to the CPU 701. The I/O port coupled to the chip set 202 comprises memory mode bit (not shown). The clock generator is coupled to the chip set 202 to generates a differential clock signal or a normal clock signal. When the memory mode bit is framed, being read by the CPU 701, the chip set 202 is operated under a double data rate mode to command the clock generator 2032 to generate differential clock signals CK+ and CK−. When the memory mode bit is not framed, the chip 202 is operated under a normal data rate mode, so that a normal clock signal CK is generated by the clock generator 2032. The memory module can be connected to be framed by coupling to a resistor R2 via a jumper J2 and when the jumper J2 is short circuited. However, the memory mode bit can also be connected to ground via the resistor R4. When the jumper J2 is open circuited, the memory mode bit is not framed. However, the memory mode bit can also be framed by being connected to ground via the jumper J2 and the resistor R4. The memory module slots meet the specification of memory module slot with 184 pins of the JEDEC standard. In addition, the reference also meets the SSTL_2 bus specification of the JEDEC standard. Alternatively, the memory module slots meet the specification of memory module slots with 224 pins.

As a conclusion, the mother board and a computer system that may flexibly uses both the DDRAM and SDRAM provided by the invention comprise at least the following advantages.

According to the invention, both the synchronous dynamic random access memory and the double data rate dynamic random access memory can be used using the same mother board.

In the invention, the voltage regulator and the terminated resistors required by a DDRAM module are formed on a terminated circuit external to the mother board, while the terminated circuit module can be inserted into any of the memory module slots on the mother board to operate under the double data rate mode. Therefore, the area of the printed circuit used for the mother board is saved.

With a memory module slot with 184 pins, the memory module slot allows the manufacturers to install the SDRAM into the memory module slot originally used for the DDRAM. The mother board can thus support both the SDRAM and the DDRAM.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A terminated circuit module, applied to a motherboard comprising a plurality of memory module slots, and each of which comprises a plurality of signal lines, the terminated circuit module comprising:

a printed circuit board that can be inserted into any of the memory module slots of the mother board to provide an electrical connection between the terminated circuit module and the memory module slots;

a voltage regulator, on the printed circuit board to provide a terminated voltage; and a plurality of terminated resistors on the printed circuit board, coupled to the voltage regulator, the terminated resistors having one end coupled to the signal lines and the other end coupled to the terminated voltage.

2. The terminated circuit module according to claim 1, wherein memory module slots meet a specification of memory module slot with 184 pins of JEDEC standard, and each of the memory module slots comprises a reference voltage pin, when the terminated circuit module is inserted into one of the memory module slots, the voltage regulator provides a reference voltage to the reference voltage pin, and the reference voltage is within a reference voltage range of a SSTL_2 bus according to the JEDEC standard.

3. The terminated circuit module according to claim 1, wherein the memory module slots meet a specification of memory module slot with 224 pins, and each of the memory module slots comprises a reference voltage pin, when the terminated circuit module is inserted into one of the memory module slots, the voltage regulator provides a reference voltage to the reference voltage pin.

4. The terminated circuit module according to claim 1, wherein the terminated voltage is 1.25V.

* * * * *